(12) United States Patent
Takeuchi

(10) Patent No.: US 8,410,427 B2
(45) Date of Patent: Apr. 2, 2013

(54) SEMICONDUCTOR DEVICE, METHOD FOR MANUFACTURING SEMICONDUCTOR DEVICE, APPARATUS FOR MANUFACTURING SEMICONDUCTOR DEVICE, AND METHOD FOR EVALUATING SEMICONDUCTOR DEVICE

(75) Inventor: Yasutaka Takeuchi, Aichi-gun (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 13 days.

(21) Appl. No.: 13/163,221

(22) Filed: Jun. 17, 2011

(65) Prior Publication Data

US 2011/0240846 A1 Oct. 6, 2011

Related U.S. Application Data

(63) Continuation of application No. PCT/JP2009/050578, filed on Jan. 16, 2009.

(51) Int. Cl.
 *H01J 49/26* (2006.01)
(52) U.S. Cl. ............... 250/282; 204/298.03; 438/652
(58) Field of Classification Search ............. 250/282; 204/298.03; 438/652
 See application file for complete search history.

(56) References Cited

U.S. PATENT DOCUMENTS

| | | | |
|---|---|---|---|
| 6,106,676 A * | 8/2000 | Terry et al. | 204/192.13 |
| 6,740,577 B2 * | 5/2004 | Jin et al. | 438/612 |
| 7,767,563 B2 * | 8/2010 | Li | 438/572 |
| 2002/0072215 A1 * | 6/2002 | Furuya | 438/613 |
| 2002/0119657 A1 * | 8/2002 | Gandikota et al. | 438/687 |
| 2004/0164421 A1 * | 8/2004 | Tellkamp | 257/772 |
| 2007/0296080 A1 | 12/2007 | Mizuno et al. | |

FOREIGN PATENT DOCUMENTS

| | | |
|---|---|---|
| JP | 58-121674 A | 7/1983 |
| JP | 5-21382 A | 1/1993 |
| JP | 9-223779 A | 8/1997 |
| JP | 10-163467 A | 6/1998 |
| JP | 2000-77359 A | 3/2000 |
| JP | 2002-075872 A | 3/2002 |
| JP | 2006-156910 A | 6/2006 |
| JP | 2007-335431 A | 12/2007 |

\* cited by examiner

*Primary Examiner* — Alexander Ghyka
*Assistant Examiner* — Stanetta Isaac
(74) *Attorney, Agent, or Firm* — Sughrue Mion, LLC

(57) ABSTRACT

The present teachings provide a method for manufacturing a semiconductor device including a semiconductor substrate and a lower surface electrode in which an aluminum containing layer, a titanium layer, a nickel layer, and a nickel oxidation-prevention layer are laminated in order from a semiconductor substrate side, wherein the titanium layer of the lower electrode is formed by sputtering in an atmosphere of a partial pressure of oxygen being equal to or less than $5 \times 10^{-6}$ Pa.

3 Claims, 7 Drawing Sheets

SEMICONDUCTOR DEVICE, METHOD FOR MANUFACTURING SEMICONDUCTOR DEVICE, APPARATUS FOR MANUFACTURING SEMICONDUCTOR DEVICE, AND METHOD FOR EVALUATING SEMICONDUCTOR DEVICE

CROSS-REFERENCE TO RELATED APPLICATION

This application is a continuation of PCT application PCT/JP2009/050578 filed on Jan. 16, 2009 designating the United States of America, the entire contents of which are incorporated by reference herein.

TECHNICAL FIELD

The present teachings relate to a semiconductor device, a method and apparatus for manufacturing the semiconductor device, and a method for evaluating the semiconductor device.

DESCRIPTION OF RELATED ART

With a semiconductor device in which a lower surface electrode comprising a plurality of metal layers is provided on a lower surface of a semiconductor substrate, for example, the lower surface electrode is first connected and fixed to an external member such as a lead frame by soldering, and wire bonding is subsequently performed on an upper surface electrode formed on an upper surface of the semiconductor substrate. For example, the lower surface electrode is configured such that an aluminum layer, a titanium layer, a nickel layer, and a gold layer are laminated in order from a semiconductor substrate side. Characteristics required for the lower surface electrode include superior adhesiveness with the semiconductor substrate or solder and a high adhesion between respective metal layers composing the lower surface electrode. Insufficiency of these characteristics in the lower surface electrode may cause a defect in the wire bonding process. Therefore, for example, Japanese Patent Application Publication No. H10-163467 proposes subjecting a lower surface electrode formed by vapor deposition to heat treatment at 400 to 450° C. in order to improve adhesion between the respective metal layers composing the lower surface electrode.

SUMMARY

Intensive studies by the present inventor have led to the following discovery. When a wire bonding process is performed on a semiconductor device that is connected and fixed to an external member by soldering, separation (i.e., a defect such as so-called cratering) may occur at an interface between a titanium layer and a nickel layer of a lower surface electrode. Therefore, in order to prevent the occurrence of such a defect, adhesion between the titanium layer and the nickel layer of the lower surface electrode must be improved. As a result of various evaluations, it was found that an oxygen content of the titanium layer in a vicinity of the interface must be adequately managed.

The present teachings have been made in consideration of the above, and an object thereof is to suppress the separation (i.e., the occurrence of the defect such as cratering) at an interface between the titanium layer and the nickel layer which compose the lower surface electrode of the semiconductor device.

The intensive studies by the present inventor have led to a discovery culminating in the present teachings where the oxygen content of the titanium layer in the vicinity of the interface between the titanium layer and the nickel layer must be sufficiently lowered in order to prevent the separation at the interface between the titanium layer and the nickel layer.

Accordingly, the present teachings provide a method for manufacturing a semiconductor device including a semiconductor substrate and a lower surface electrode in which an aluminum layer (including an aluminum containing layer), a titanium layer, a nickel layer, and a nickel oxidation-prevention layer are laminated in order from a semiconductor substrate side, wherein the titanium layer of the lower electrode is formed by sputtering in an atmosphere of a partial pressure of oxygen being equal to or less than $5 \times 10^{-6}$ Pa.

The intensive studies by the present inventor have led to a discovery that, during the sputtering process of the titanium layer, the occurrence of a defect such as the cratering can be suppressed by managing the partial pressure of oxygen. When the titanium layer is formed by performing sputtering in the atmosphere of the partial pressure of oxygen being equal to or less than $5 \times 10^{-6}$ Pa, a the oxygen content of the titanium layer in the vicinity of the interface between the titanium layer and the nickel layer can be sufficiently lowered. As a result, the adhesion between the titanium layer and the nickel layer is improved and the separation (i.e., the occurrence of a defect such as the cratering) at the interface between the titanium layer and the nickel layer can be reduced. In addition, since an excessive operation of a decompressor during the sputtering process of the titanium layer need no longer be performed, efficiency of a manufacturing process can also be improved.

With the method for manufacturing a semiconductor device according to the present teachings, further, the nickel layer is preferably also formed by sputtering in the atmosphere of the partial pressure of oxygen being equal to or less than $5 \times 10^{-6}$ Pa. The oxygen content of the nickel layer in the vicinity of the interface between the titanium layer and the nickel layer can be lowered and adhesion of the interface between the titanium layer and the nickel layer can be further improved.

Alternatively, the method for manufacturing a semiconductor device according to the present teachings can be performed by a manufacturing method including steps of: (1) exchanging a target in a chamber of a sputtering apparatus in which the titanium layer is to be sputtered; (2) adjusting a partial pressure of oxygen in the chamber to be equal to or less than a threshold pressure that is predeterminedly set within a range equal to or less than $5 \times 10^{-6}$ Pa after the step (1); and (3) starting sputtering in a case where the partial pressure of oxygen in the chamber has become equal to or less than the threshold pressure.

The present teachings are alternatively capable of providing an apparatus for performing the method for manufacturing a semiconductor device. The apparatus for manufacturing the semiconductor device according to the present teachings include: a sputtering apparatus; a detector that detects a partial pressure of oxygen in a chamber of the sputtering apparatus; an adjustor that adjusts the partial pressure of oxygen in the chamber; and a controller. The controller controls the adjustor according to a detected value of the detector so that a titanium layer is formed by sputtering in an atmosphere of the partial pressure of oxygen being equal to or less than $5 \times 10^{-6}$ Pa.

Furthermore, in the apparatus for manufacturing a semiconductor device according to the present teachings, the controller may control the sputtering apparatus to start sputtering in a case where the detected value of the detector is equal to or less than a threshold pressure that is predeterminedly set within a range equal to or less than $5 \times 10^{-6}$ Pa.

The present teachings is alternatively capable of providing a semiconductor device with a low defective rate. The intensive studies by the present inventor have led to a discovery that separation at the interface between the titanium layer and the nickel layer can be prevented with a semiconductor device including: a semiconductor substrate; and an lower surface electrode in which an aluminum containing layer, a titanium layer, a nickel layer, and a nickel oxidation-prevention layer are laminated in order from a semiconductor substrate side, wherein an oxygen atom count detected by Secondary Ion Mass Spectrometry in an interface between the titanium layer and the nickel layer is equal to or less than $2 \times 10^4$ counts per second.

Moreover, the present teachings are alternatively capable of providing a method for evaluating quality of a semiconductor device. In the method for evaluating quality according to the present teachings, the semiconductor device is judged as having superior panty in a case where an oxygen atom count detected by Secondary Ion Mass Spectrometry in an interface between the titanium layer and the nickel layer is equal to or less than a threshold number that is predeterminedly set within a range equal to or less than $2 \times 10^4$ counts per second. Consequently, defective products in which separation occurs at the interface between the titanium layer and the nickel layer of the lower surface electrode or the like can be eliminated. For example, a semiconductor device in which a defect such as cratering is likely to occur can be eliminated prior to performing a soldering process or a wire bonding process.

According to the present teachings, the efficiency of the manufacturing process can be improved while suppressing the occurrence of defects in semiconductor devices in which the separation occurs at the interface between the titanium layer and the nickel layer composing the lower surface electrode.

DETAILED DESCRIPTION OF EMBODIMENT

Preferred aspects of below embodiments will be listed.
1. A gold (Au) layer is used as a nickel oxidation-prevention layer.
2. An aluminum-silicon alloy (Al—Si) is used as an aluminum containing layer.

Embodiments

Figure 1:
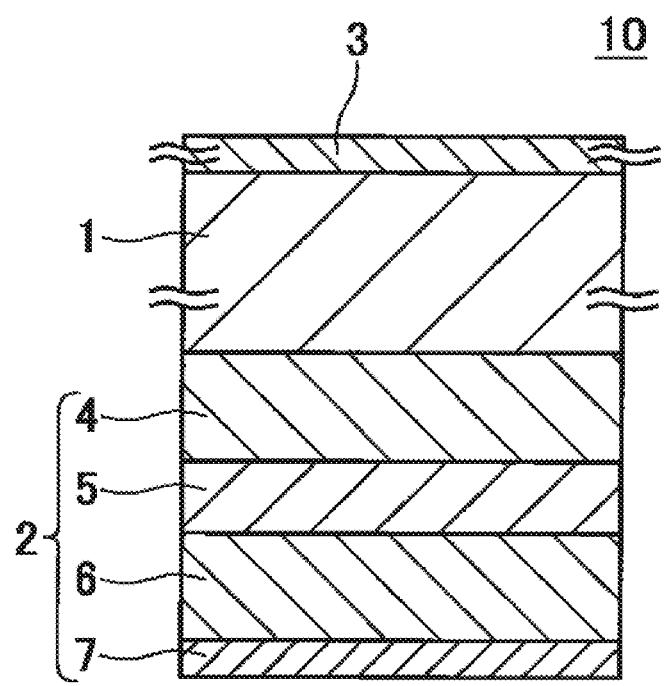
FIG. 1 is a diagram showing a semiconductor device according to an embodiment.

Hereinafter, an embodiment of the present teachings will be described with reference to the drawings. As shown in FIG. 1, a semiconductor device 10 according to the present embodiment comprises a semiconductor substrate 1, a lower surface electrode Z and an upper surface electrode 3. In the lower surface electrode 2, an aluminum-silicon alloy (Al—Si) layer 4 as an aluminum containing layer, a titanium (Ti) layer 5, a nickel (Ni) layer 6, and a gold (Au) layer 7 as a nickel oxidation-prevention layer are laminated in this order from a side of the semiconductor substrate 1. For the aluminum containing layer, an Al alloy may be used as in the present embodiment or high purity Al may alternatively be used. A semiconductor substrate comprising circuitry formed on a silicon substrate, a silicon carbide substrate, or the like may be used as the semiconductor substrate 1. In the present embodiment, the Al—Si layer has a thickness of 800 nm, the Ti layer has a thickness of 200 nm, the Ni layer 6 has a thickness of 700 nm, and the Au layer 7 has a thickness of 100 nm.

Figure 2A:
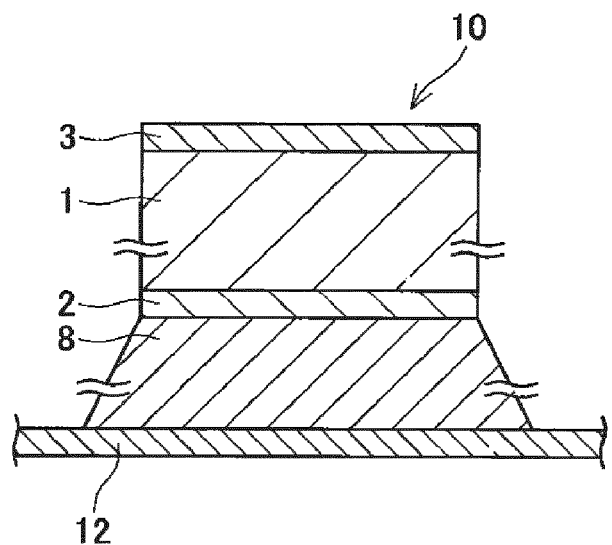
FIG. 2A is a diagram showing a state where the semiconductor device according to the embodiment is connected to an external member.
Figure 2B:
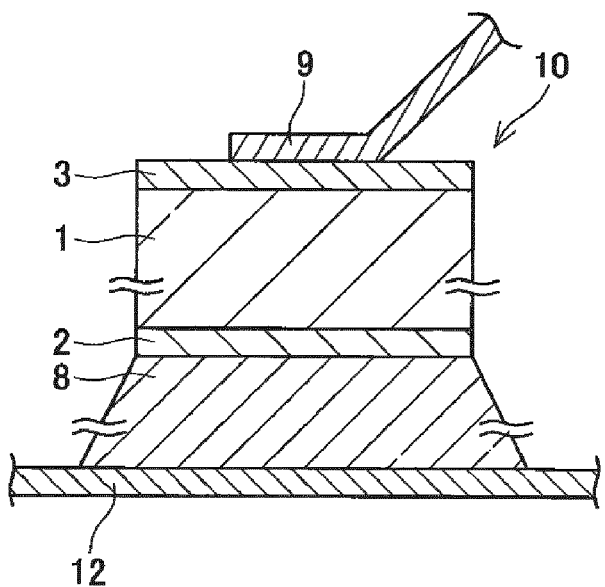
FIG. 2B is a diagram showing a state where the semiconductor device according to the embodiment is connected to an external member.

As shown in FIG. 2A, the semiconductor device 10 is connected and fixed to an external member 12 such as a lead frame by soldering the lower surface electrode 2 of the semiconductor device 10. In this state, a thickness from an upper surface of the upper surface electrode to a lower surface of a solder layer 8 is approximately 165 μm, and a thickness of the solder layer 8 is approximately 100 μm. The solder layer 8 is made of a tin (Sn) alloy. After soldering is performed, when the upper surface electrode 3 of the semiconductor device 10 is connected with a wire 9 and brought into a conduction state with an inner lead of a lead frame in a wire bonding process, a state shown in FIG. 2B is achieved.

A method for manufacturing the lower surface electrode 2 of the semiconductor device 10 according to the present embodiment will be described. After forming the upper surface electrode 3 on an upper surface of a wafer in which a semiconductor element is formed, the Al—Si layer 4, the Ti layer 5, the Ni layer 6, and the Au layer 7 are formed by sputtering in this order on a lower surface of the wafer to form the lower surface electrode 2.

Figure 3:
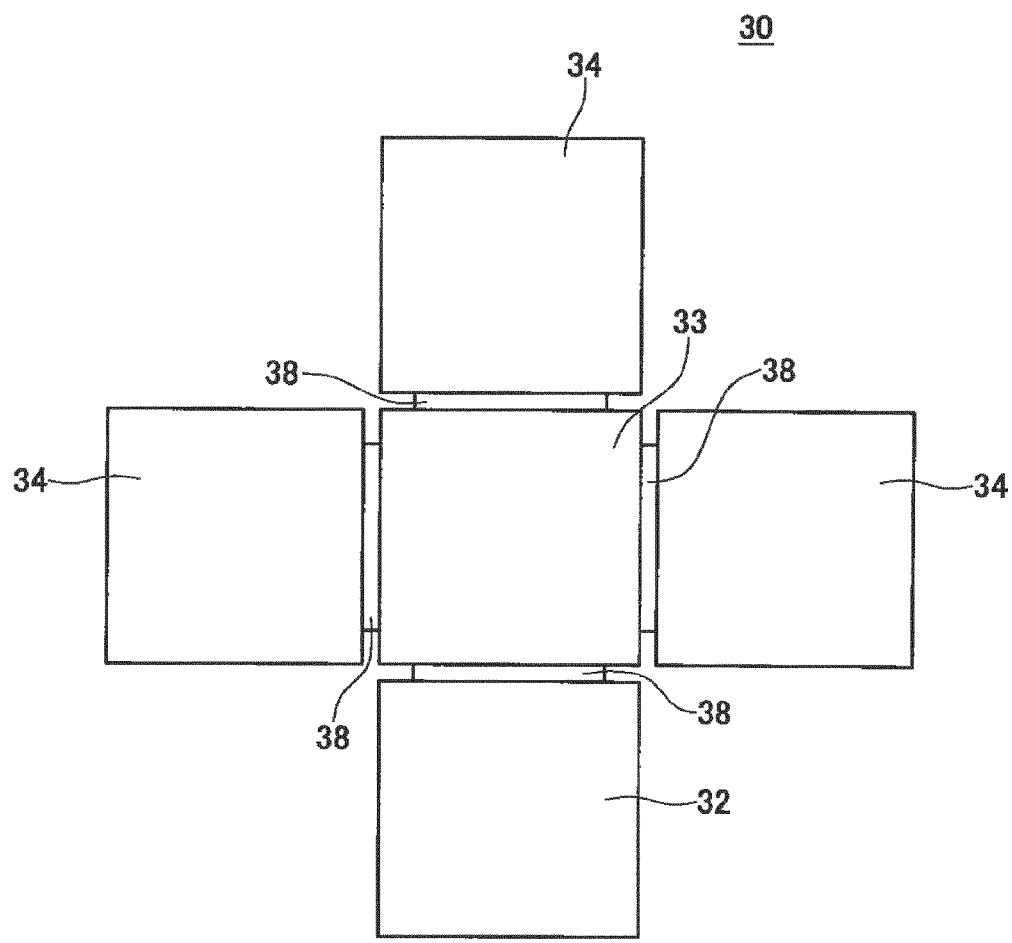
FIG. 3 is a diagram showing a sputtering apparatus comprising a manufacturing apparatus for manufacturing the semiconductor device according to the embodiment.
Figure 4:
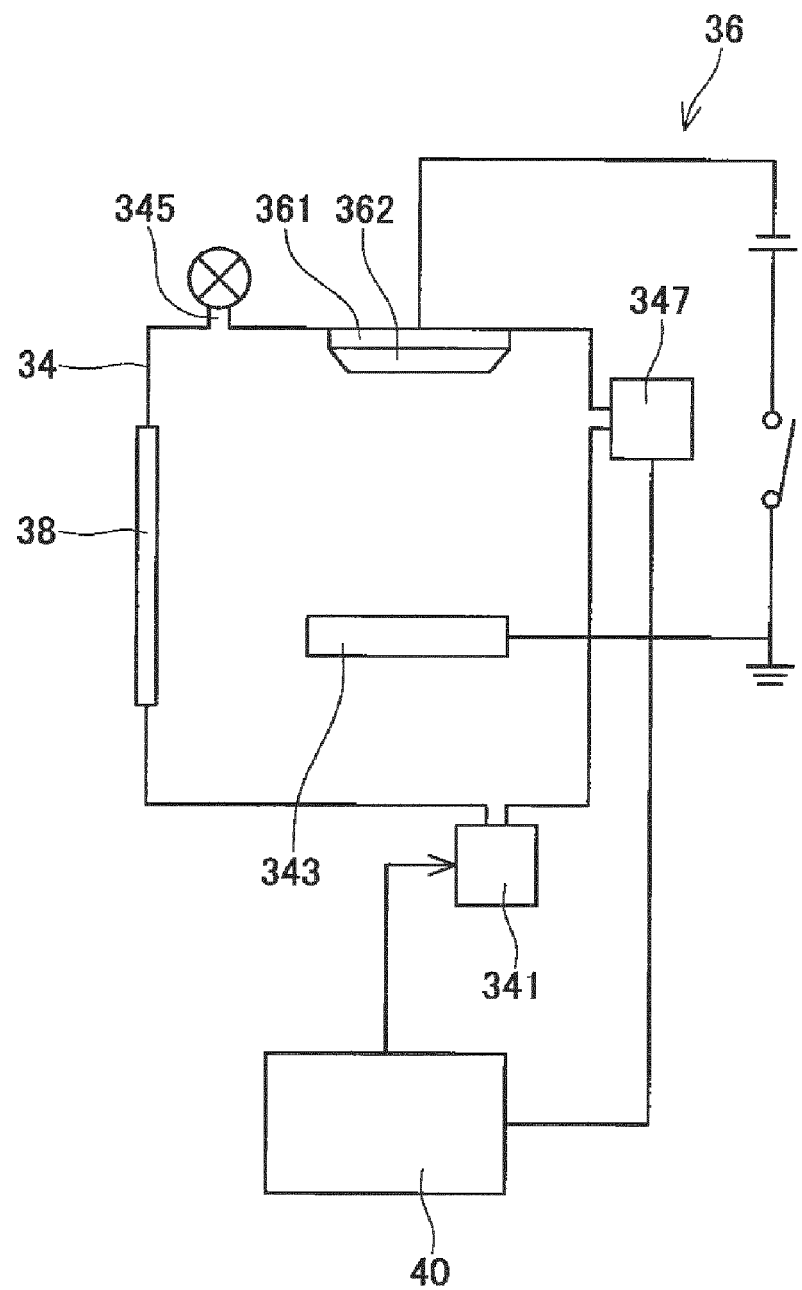
FIG. 4 is a diagram showing the a sputtering apparatus comprising the manufacturing apparatus for manufacturing the semiconductor device according to the embodiment.

FIGS. 3 and 4 are schematic diagrams showing a configuration of a sputtering apparatus 30 that is used to form the lower surface electrode 2 according to the present embodiment. The sputtering apparatus 30 comprises a load lock chamber 32 separated by an openable and closeable door valve 38, a conveying chamber 33, a plurality of sputtering chambers 34, a conveying mechanism (not shown), and a controller 40. Decompression ports (not shown) connected to a decompressor (denoted by reference numeral 341 in FIG. 4) are respectively installed in the load lock chamber 32, the conveying chamber 33, and the plurality of sputtering chambers 34. A vacuum pump such as a dry pump, a turbo-molecular pump, and a cryopump can be suitably used as the decompressor. The decompressor may be installed in each chamber or may be shared by a plurality of chambers. The conveying chamber 33 is installed in order to enable the wafer to be transferred in a vacuum between different chambers.

The load lock chamber 32 and the plurality of sputtering chambers 34 are connected to each other via the conveying chamber 33. For the conveying mechanism, for example, a frog-legged robot that holds a side surface of the wafer can be used. The conveying mechanism holds one wafer at a time to convey the wafer through the load lock chamber 32, the conveying chamber 33, and the sputtering chambers 34.

The load lock chamber 32 comprises a wafer inlet (not shown) and a wafer outlet (not shown). The wafer is conveyed to the load lock chamber 32 in a state where, for example, a plurality of wafers is mounted on a magazine set. The conveying mechanism retrieves one wafer at a time from the magazine set and conveys the wafer through the load lock chamber 32, the conveying chamber 33, and the sputtering chambers 34.

As shown in FIG. 4, the plurality of sputtering chambers 34 respectively comprises a deposition device 36, a gas supply channel 345, and a detector 347 that detects a partial pressure of oxygen. A stage 343 is provided in the sputtering chambers 34. A dielectric layer is provided on the stage 343. The stage 343 applies a voltage between the stage 343 and the wafer, and suctions and holds the wafer using a force generated between the stage 343 and the wafer (a so-called electrostatic chuck). The stage 343 comprises a heating unit (not shown) for heating the wafer and a cooling unit (not shown). A vacuum pump may be used as the decompressor 341. The decompressor 341 is electrically connected to the controller 40. Operation of the decompressor 341 is controlled by the controller 40. For the detector 347, for example, a quadrupolar gas analyzer capable of measuring a type and a partial pressure of a residual gas in the vacuum can be used. The detector 347 is electrically connected to the controller 40. A detection result (a gas type and a partial pressure per type) by the detector 347 is output to the controller 40. In the present embodiment, Ar gas can be introduced into the sputtering chambers 34 by the gas supply channel 345.

The deposition device 36 comprises a backing plate 361 and a target 362. A face of the backing plate 361 on a side opposite to a face on which the target 362 is mounted is cooled by cooling water (not shown). The deposition device 36 is configured so as to be capable of applying a high voltage between the target 362 and the wafer mounted on the stage 343. The target 362 and the stage 343 are arranged opposing and separated from each other in the sputtering chambers 34. The target 362 is exchanged in accordance with an electrode layer to be formed. In the present embodiment, a target 362 made of a different metal is provided in each of the plurality of sputtering chambers 34. As the wafer is conveyed into and out from the plurality of sputtering chambers 34 through the conveying chamber 33, the Al—Si layer 4, the Ti layer 5, the Ni layer 6, and the Au layer 7 are formed on the lower surface of the wafer. In the present embodiment, a sputtering chamber for forming the Al—Si layer 4 and the Ti layer 5, a sputtering chamber for forming the Ni layer 6, and a sputtering chamber for forming the Au layer 7 are installed.

In a process for manufacturing the lower surface electrode of the semiconductor device according to the present embodiment, first, a magazine set on which the wafer is mounted is conveyed to the load lock chamber 32 in a state where the door valve 38 is closed. The controller 40 closes the load lock chamber 32 and activates the decompressor, and opens the decompression port installed in the load lock chamber 32 to decompress the load lock chamber 32.

Once the decompression inside the load lock chamber 32 is completed, the controller 40 opens the door valve 38 separating the load lock chamber 32 from the conveying chamber 33, then causes the wafer mounted on the magazine set to be moved by the conveying mechanism from the load lock chamber 32 to the conveying chamber 33, and closes the aforementioned door valve 38 separating the load lock chamber 32 from the conveying chamber 33. Next, the controller 40 opens another door valve 38 separating the conveying chamber 33 from the sputtering chamber 34, and causes the wafer to be moved by the conveying mechanism to the stage 343 of the sputtering chamber 34. At this point, the insides of the conveying chamber 33 and the sputtering chamber 34 have already been decompressed by the decompressor 341. The conveying mechanism mounts the wafer onto the stage 343 of the sputtering chamber 34 so that the lower surface of the wafer faces the target 362. Subsequently, the controller 40 closes the door valve 38 separating the conveying chamber 33 from the sputtering chamber 34.

Once the decompression of the sputtering chamber 34 is completed, the controller 40 operates the decompressor 341 while introducing Ar gas into the sputtering chamber 34 from the gas supply channel 345.

In this state, a high voltage is applied between the target 362 and the wafer. As a result, ionized Ar collides with the target 362. Due to the energy produced by the collision of the Ar ions, metal atoms constituting the target 362 are knocked out from the target 362. The knocked out metal atoms accumulate on the lower surface of the wafer facing the target 362. Accordingly, a layer of the metal that had been constituting the target 362 is formed on the lower surface of the wafer. Once the sputtering process performed in the sputtering chamber containing the wafer is completed, the controller 40 opens the door valve 38 separating the conveying chamber 33 from the sputtering chamber 34, causes the wafer to be moved to the next sputtering chamber 34 by the conveying mechanism, and forms another metal layer in the same manner. As shown, by sequentially performing the sputtering using different targets 362, metal layers are laminated on the lower surface of the wafer in an order of the Al—Si layer 4, the Ti layer 5, the Ni layer 6, and the Au layer 7, and the lower surface electrode 2 is formed on the lower surface of the wafer. Moreover, in the manufacturing process, preprocessing in which several surplus wafers are processed is performed after replacing the target 362 or before manufacturing products. The products are manufactured after such preprocessing. Once the preprocessing is completed, the sputtering is performed on the wafer to manufacture the products after having decompressed the sputtering chamber 34.

Specifically, first, the Al—Si layer 4 is formed. A target made of an Al—Si alloy is used as the target 362. The wafer is conveyed to the sputtering chamber 34 in which the preprocessing has been completed, and the wafer is installed in a position opposing the target 362. The controller 40 controls the decompressor 341 according to a decompression operational condition that is predeterminedly set to specifically decompress the sputtering chamber 34, and heats the stage 343 to 70° C. Once the decompression is completed, introduction of Ar gas from the gas supply channel 345 is started and the deposition device 36 is operated according to an input voltage and a sputtering time indicated in Table 1. The Al—Si layer 4 is formed on the lower surface of the wafer by operating the deposition device 36 according to the input power and the sputtering time corresponding to the Al—Si layer indicated in Table 1.

TABLE 1

| Layer to be formed | Input power | Sputtering time |
| --- | --- | --- |
| Al—Si layer | 8 kW | 71 seconds |
| Ti layer | 3 kW | 68 seconds |
| Ni layer | 6 kW | 85 seconds |
| Au layer | 1 kW | 25 seconds |

Next, the Ti layer 5 is formed. The target 362 is replaced with a target made of Ti. The wafer is set so as to oppose the target 362. The controller 40 controls the decompressor 341 according to a decompression operational condition that is predeterminedly set to specifically decompress the sputtering chamber 34, and heats the stage 343 to 70° C. The decompression condition can be determined by performing an experiment in advance. For example, the decompression condition is set in which the sputtering can be performed in an atmosphere of a partial pressure of oxygen being equal to or less than $5\times10^{-6}$ Pa. The controller 40 operates the decompressor 341 according to the decompression condition to create the state where the partial pressure of oxygen in the sputtering chamber 34 is equal to or less than $5\times10^{-6}$ Pa. Subsequently, the deposition device 36 is operated to start sputtering. Even when the sputtering is in progress, the controller 40 controls the decompressor 341 so that the partial pressure of oxygen in the sputtering chamber 34 is maintained equal to or less than $5\times10^{-6}$ Pa. The Ti layer 5 is formed on the lower surface of the wafer by operating the deposition device 36 according to the input power and the sputtering time corresponding to the Ti layer indicated in Table 1.

Next, the Ni layer 6 is formed. The wafer is conveyed to the sputtering chamber 34 including the target 362 made of Ni. The wafer is conveyed to a position that opposes the target 362. The controller 40 controls the decompressor 341 according to a decompression operational condition that is predeterminedly set to specifically decompress the sputtering chamber 34, and cools the wafer by a cooling unit of the stage 343. The decompression condition can be determined by performing an experiment in advance and is set to a condition in which the sputtering can be performed in the atmosphere of the partial pressure of oxygen being equal to or less than $5\times10^{-6}$ Pa. The controller 40 operates the decompressor 341 according to the decompression condition to create the state where the partial pressure of oxygen in the sputtering chamber 34 is equal to or less than $5\times10^{-6}$ Pa. Subsequently, the deposition device 36 is operated to start sputtering. Even when the sputtering is in progress, the controller 40 controls the decompressor 341 so that the partial pressure of oxygen in the sputtering chamber 34 is maintained equal to or less than $5\times10^{-6}$ Pa. The Ni layer 6 is formed on the lower surface of the wafer by operating the deposition device 36 according to the input power and the sputtering time corresponding to the Ni layer indicated in Table 1.

Furthermore, the Au layer 7 is formed. The wafer is conveyed to the sputtering chamber 34 including the target 362 made of Au. The wafer is conveyed to a position that opposes the target 362. The controller 40 controls the decompressor 341 according to a decompression operational condition that is predeterminedly set to specifically decompress the sputtering chamber 34, and cools the wafer by an electrostatic chuck of the stage 343. Once decompression is completed, the Au layer 7 is formed on the lower surface of the wafer by operating the deposition device 36. The semiconductor device 10 can be manufactured by dicing the wafer after the lower surface electrode 2 is formed on the wafer as described above.

Moreover, while the controller 40 implements the decompression operational conditions that are predeterminedly set in the present embodiment, the controller 40 may alternatively control the decompressor 341 according to a partial pressure of oxygen detected by the detector 347 to start sputtering. For example, during the process for forming the Ti layer 5, the Ni layer 6, or the like by sputtering, the controller 40 may control the deposition device 36 to start sputtering according to a threshold A that is predeterminedly set within a range equal to or less than $5\times10^{-6}$ Pa when the partial pressure of oxygen detected by the detector 347 becomes equal to or less than the threshold A. Since the operation of the decompressor 341 by the controller 40 is continued until the partial pressure of oxygen becomes equal to or less than the threshold A ($\leq 5\times10^{-6}$ Pa) and the sputtering is subsequently started, the sputtering can be reliably performed in the atmosphere in which the partial pressure of oxygen is equal to or less than $5\times10^{-6}$ Pa.

By changing the condition of the decompression process performed at the sputtering chamber 34 as shown in Table 2, the partial pressure of oxygen inside the sputtering chamber 34 where the Ti layer formation process was performed was adjusted and the lower surface electrode of the semiconductor device was fabricated. A Basic Process Gas Monitor Qulee BGM made by ULVAC, Inc. was used as the detector 347 for detecting the partial pressure of oxygen according to the present embodiment. In Table 2, values detected by the detector 347 are shown together with the partial pressure of oxygen inside the sputtering chamber after performing the decompression process. Furthermore, after soldering and wire-bonding the semiconductor devices fabricated in examples and in a comparative example, the number of samples in which cratering had occurred was studied. The result of the study is also shown in Table 2.

FIRST EXAMPLE

In a first example, the preprocessing was performed for 12 hours before forming the Ti layer 5 by sputtering. After performing preprocessing, the decompression (vacuuming) was performed for six hours using the decompressor 341 provided in the sputtering chamber 34. The partial pressure of oxygen inside the sputtering chamber 34 after performing the decompression process was $5\times10^{-6}$ Pa. A study of the number of samples in which the cratering had occurred using 35 semiconductor devices 10 fabricated according to the first example revealed that there were no samples in which the cratering had occurred.

SECOND EXAMPLE

In a second example, after performing the preprocessing for 12 hours, the decompression (vacuuming) was performed for nine hours using the decompressor 341 provided in the sputtering chamber 34. The partial pressure of oxygen inside the sputtering chamber 34 after performing the decompression process was $3\times10^{-6}$ Pa. A study of the number of samples in which the cratering had occurred using 35 semiconductor devices 10 fabricated according to the second example revealed that there were no samples in which cratering had occurred.

COMPARATIVE EXAMPLE

In a comparative example, after performing the preprocessing for 12 hours, the decompression (vacuuming) was performed for one hour using the decompressor 341 provided in the sputtering chamber 34. The partial pressure of oxygen inside the sputtering chamber 34 after performing the decompression process was $7\times10^{-6}$ Pa. A study of the number of samples in which cratering had occurred using 35 semiconductor devices 10 fabricated according to the comparative example revealed that the cratering had occurred in six samples.

TABLE 2

|  | Decompression time | Partial pressure of oxygen [Pa] | Number of cratering occurrences/Number of manufactured samples |
| --- | --- | --- | --- |
| First example | 6 hours | $5 \times 10^{-6}$ | 0/35 |
| Second example | 9 hours | $3 \times 10^{-6}$ | 0/35 |
| Comparative example | 1 hour | $7 \times 10^{-6}$ | 6/35 |

A comparison of the partial pressure of oxygen and a frequency of cratering occurrence in the first and second examples and the comparative example shown in Table 2 reveals that the occurrence of cratering can be effectively suppressed by setting the partial pressure of oxygen inside the sputtering chamber 34 to be equal to or less than $5 \times 10^{-6}$ Pa in the process of forming the Ti layer 5 as in the cases of the first and second examples.

Figure 5:
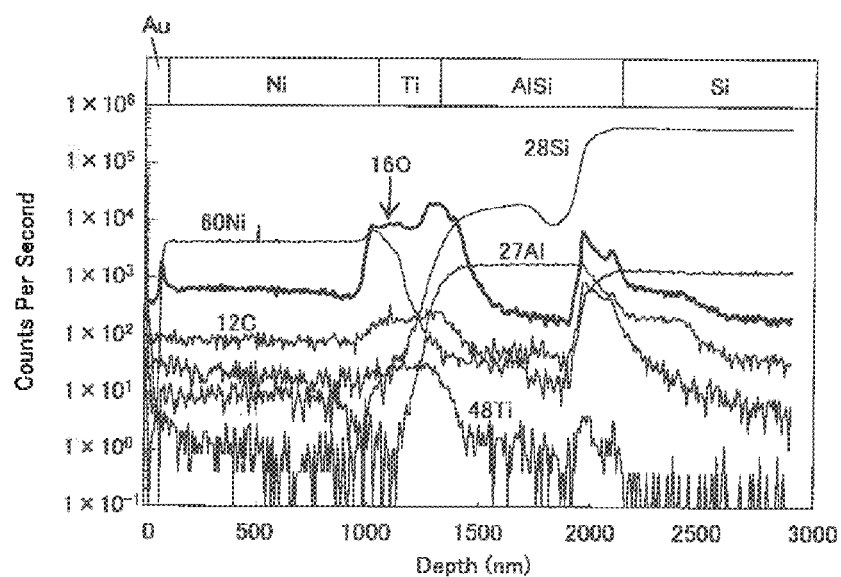
FIG. 5 shows a SIMS analysis result of a lower surface electrode of the semiconductor device according to the embodiment.

The lower surface electrode of the semiconductor device fabricated according to the second example was analyzed by Secondary Ion Mass Spectrometry (SIMS). A result thereof is shown in FIG. 5. An ADEPT 1010 made by ULVAC-PHI Incorporated was used as an SIMS analyzer and measurement was performed under a condition where Cs+ was used as a primary ion and primary ion acceleration energy was set to 3 keV. Similarly, the SIMS analysis was performed on the lower surface electrode of the semiconductor device fabricated according to the comparative example. A result thereof is shown in FIG. 6.

Figure 6:
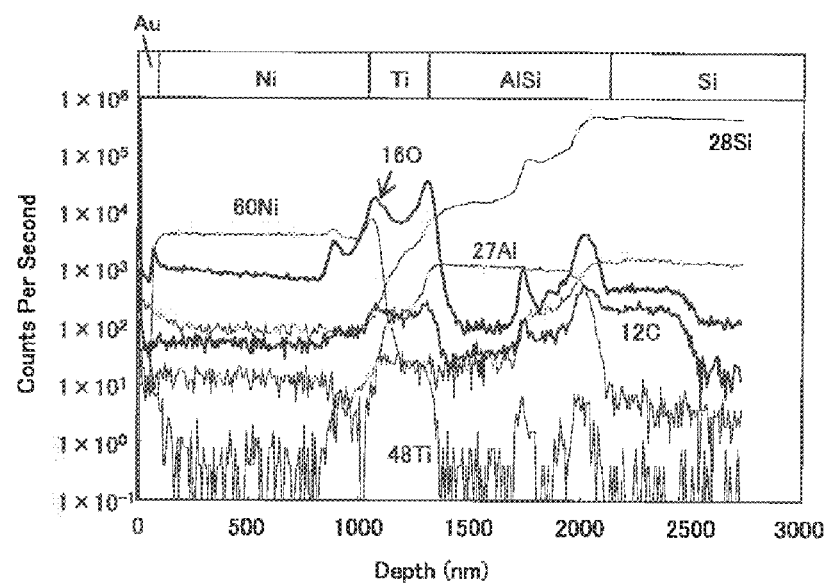
FIG. 6 shows a SIMS analysis result of a lower surface electrode of a semiconductor device according to a comparative example.

A comparison of FIGS. 5 and 6 reveals that, in FIG. 6, a sharp peak in oxygen atom counts per second detected by the SIMS analysis exists at an interface between the Ti layer and the Ni layer. In FIG. 6, the oxygen atom count per second detected by the SIMS of the Ti layer at the interface between the Ti layer and the Ni layer is greater than $2 \times 10^4$. This indicates a similar result as the conventional defective sample shown in FIG. 7. On the other hand, in FIG. 5, the oxygen atom count per second detected by the SIMS analysis does not have a peak at the interface between the Ti layer and the Ni layer. In FIG. 5, the oxygen atom count per second detected by the SIMS of the Ti layer at the interface between the Ti layer and the Ni layer is equal to or smaller than $2 \times 10^4$. From these results, it is revealed that by performing the sputtering process of the Ni layer under the condition where the partial pressure of oxygen is lower than $5 \times 10^{-6}$ Pa, the oxygen content can be lowered at the interface between the Ti layer and the Ni layer.

Figure 8:
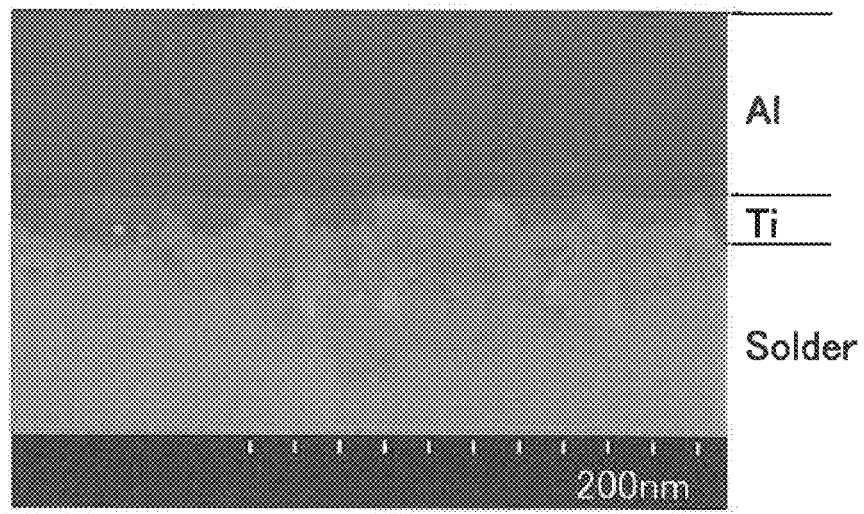
FIG. 8 is a SEM image showing a cross section of the lower surface electrode of the conventional semiconductor device.
Figure 9:
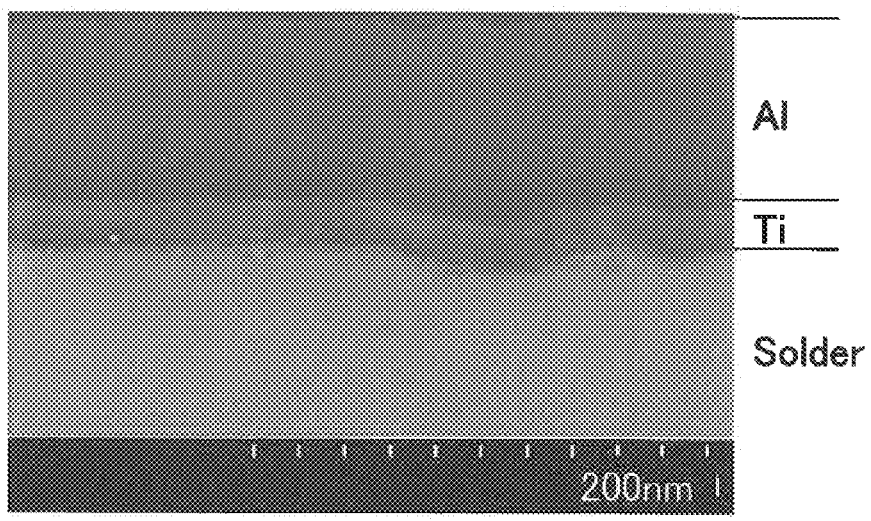
FIG. 9 is a SEM image showing a cross section of the lower surface electrode of the conventional semiconductor device.

FIG. 8 shows an SEM photograph of a cross section of a solder layer and a lower surface electrode of a cratering-free sample having superior quality when semiconductor devices fabricated according to the conventional sputtering process are subjected to the soldering process and the wire bonding process. In contrast, FIG. 9 shows an SEM photograph of a cross section of a solder layer and a lower surface electrode of a defective sample in which the cratering has occurred when semiconductor devices fabricated according to the conventional sputtering process are subjected to the soldering process and the wire bonding process. As shown in FIG. 9, the lower surface electrode of the defective product in which the cratering has occurred is in a state where the respective metal layers form distinctive layers from the solder layer to the Al—Si layer. In contrast, FIG. 8 showing a state of the lower surface electrode of the cratering-free product having superior quality reveals that the distinctive interface is not formed from the Ti layer to the solder layer and that an alloy is formed by the solder layer, the Ni layer, and the Ti layer.

Figure 7:
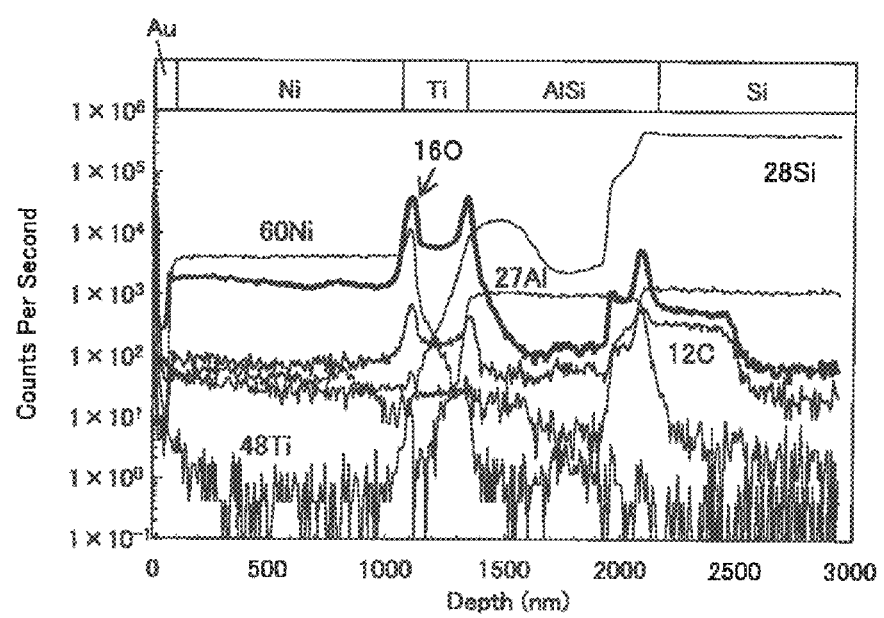
FIG. 7 shows a SIMS analysis result of a lower surface electrode of a conventional semiconductor device.

FIG. 7 shows an SIMS analysis result of the lower surface electrode of the defective sample described above. An ADEPT 1010 made by ULVAC-PHI Incorporated was used as the SIMS analyzer and measurement was performed under a condition where Cs+ was used as a primary ion and primary ion acceleration energy was set to 3 keV. As shown in FIG. 7, a sharp peak in the oxygen atom counts per second detected by the SIMS analysis is observed in the defective sample at the interface between the Ti layer and the Ni layer in the same manner as in FIG. 6. From the analysis results shown in FIGS. 5 to 9, it is inferable that alloying of the solder layer, the Ni layer, and the Ti layer cannot be achieved as shown in FIG. 9 if an oxygen concentration of the Ti layer at the interface between the Ti layer and the Ni layer is too high. In other words, as will be described later, by appropriately managing the partial pressure of oxygen during the formation of the Ti layer and the Ni layer, the oxygen content of the Ti layer can be lowered at the interface between the Ti layer and the Ni layer and the adhesion between the lower surface electrode and the solder layer can be improved. As a result, the occurrence of separation (cratering) at the interface between the Ti layer and the Ni layer can be suppressed.

With the semiconductor device according to the first example, a state where oxygen content does not have a peak at the interface between the Ti layer and the Ni layer can be obtained. Therefore, as shown in FIG. 8, it is inferable that a state is achieved in which an alloy layer is formed by the solder layer and by the Ti layer and Ni layer of the lower surface electrode and that the occurrence of separation (cratering) at the interface between the Ti layer and the Ni layer is suppressed.

As described above, by forming the lower surface electrode of the semiconductor device using the manufacturing method according to the present embodiment, the oxygen content can be lowered at the interface between the Ti layer and the Ni layer. Therefore, the occurrence of separation (cratering) at the interface of the Ti layer and the Ni layer of the lower surface electrode can be effectively suppressed during the wire bonding process.

In addition, in the semiconductor device comprising the semiconductor substrate and the lower surface electrode in which the Al-containing layer, the Ti layer, a Ni layer, and the Ni oxidation-prevention layer are laminated in order from the semiconductor substrate side as is the case of the present embodiment, the separation at the interface between the Ti layer and the Ni layer can be prevented when the oxygen atom count detected by Secondary Ion Mass Spectrometry in the Ti layer at the interface between the Ti layer and the Ni layer is equal to or less than $2 \times 10^4$ counts per second.

Using these findings, a quality evaluation of the semiconductor device can be performed. For example, the Secondary Ion Mass Spectrometry is performed on the lower surface electrode of the semiconductor device provided with the semiconductor substrate and the lower surface electrode in which the Al-containing layer, the Ti layer, the Ni layer, and the Ni oxidation-prevention layer are laminated in order from the semiconductor substrate side. The semiconductor device is judged as having superior quality in a case where the oxygen atom count detected by Secondary Ion Mass Spectrometry of the Ti layer at the interface between the Ti layer and the Ni layer is equal to or less than a threshold number that is predeterminedly set within the range equal to or less than $2 \times 10^4$ counts per second. Consequently, the defective products in which the separation may occur at the interface between the Ti layer and the Ni layer of the lower surface electrode can be eliminated. For example, a semiconductor device in which a defect such as cratering is likely to occur can be eliminated prior to performing the soldering process or the wire bonding process. Conventionally, a study of cratering or the like that occurs during the wire bonding process requires soldering and a separation test or the like to be actually performed. Implementing a judgment method in which the oxygen content of the interface between the Ti layer and the Ni layer of the lower surface electrode using the SIMS analysis enables the quality of the semiconductor device to be evaluated before performing the soldering and may contribute towards improving the efficiency of the manufacturing process.

Although an embodiment of the present teachings has been described using specific terms, such a description is for illustrative purposes only and is not intended to limit the scope of the following claims. The technology described in the claims is to include various modifications and changes made to the specific examples illustrated above.

The technological components illustrated in the present description and the accompanying drawings are designed such that the technical utility thereof is to be exercised either singularly or in combination, and are not limited to the combinations described in the claims upon application. In addition, the technology exemplified in the present description and the accompanying drawings are capable of simultaneously achieving a plurality of objects, whereby achieving one of such objects offers technical utility.

What is claimed is:

1. An apparatus for manufacturing a semiconductor device including a semiconductor substrate and a lower surface electrode in which an aluminum containing layer, a titanium layer, a nickel layer, and a nickel oxidation-prevention layer are laminated in order from a semiconductor substrate side, the apparatus comprising:
   a sputtering apparatus;
   a detector that detects a partial pressure of oxygen in a chamber of the sputtering apparatus;
   a decompressor that adjusts the partial pressure of oxygen in the chamber; and
   a controller that is electrically connected to the decompressor and the detector, and controls the decompressor according to a detected value of the detector and decreases the partial pressure of oxygen in the chamber to be within equal to or more than $3 \times 10^{-6}$ Pa and equal to or less than $5 \times 10^{-6}$ Pa when the sputtering apparatus forms the titanium layer by sputtering.

2. The apparatus according to claim 1, wherein the controller controls the sputtering apparatus to start sputtering to form the titanium layer in a case where the detected value is equal to or less than a threshold pressure that is predeterminedly set within a range equal to or more than $3 \times 10^{-6}$ Pa and equal to or less than $5 \times 10^{-6}$ Pa.

3. A method for evaluating quality of a semiconductor device including a semiconductor substrate and a lower surface electrode in which an aluminum containing layer, a titanium layer, a nickel layer, and a nickel oxidation-prevention layer are laminated in order from a semiconductor substrate side,
   wherein the semiconductor device is judged as having superior quality in a case where an oxygen atom counts detected by Secondary Ion Mass Spectrometry in an interface between the titanium layer and the nickel layer is equal to or less than a threshold number that is predeterminedly set within a range equal to or less than $2 \times 10^4$ counts per second.

* * * * *